(12) United States Patent
Premerlani et al.

(10) Patent No.: US 7,444,248 B2
(45) Date of Patent: Oct. 28, 2008

(54) SYSTEM AND METHOD FOR SYNCHRONIZED PHASOR MEASUREMENT

(75) Inventors: William James Premerlani, Scotia, NY (US); Bogdan Zdzislaw Kasztenny, Ontario (CA); Mark Gerard Adamiak, Paoli, PA (US)

(73) Assignee: General Electric Company, Niskayuna, NY (US)

( * ) Notice: Subject to any disclaimer, the term of this patent is extended or adjusted under 35 U.S.C. 154(b) by 176 days.

(21) Appl. No.: 11/119,113

(22) Filed: Apr. 29, 2005

(65) Prior Publication Data

US 2006/0247874 A1    Nov. 2, 2006

(51) Int. Cl.
  *G01R 19/00* (2006.01)
(52) U.S. Cl. ...................................... 702/64
(58) Field of Classification Search ............... 702/60, 702/64, 89
  See application file for complete search history.

(56) References Cited

U.S. PATENT DOCUMENTS 6,141,196 A * 10/2000 Premerlani et al. ............ 361/78
6,662,124 B2  12/2003 Schweitzer, III et al. ...... 702/65
6,754,597 B2   6/2004 Bertsch et al. ................ 702/57
6,915,219 B2 *  7/2005 Premerlani .................... 702/58
6,934,654 B2 *  8/2005 Benmouyal .................. 702/106

OTHER PUBLICATIONS

Kasztenny et al., "Synchrophasor Algorithm Allowing Seamless Integration Relays", Mar. 2008.*
Jiang et al., "A Distributed State Estimator Utilizing Synchronized Phasor Measurements", 2007.*
Gabriel Benmouyal, E. O. Schweitzer, A. Guzmán; "Synchronized Phasor Measurement in Protective Relays for Protection, Control, and Analysis of Electric Power Systems"; Presented before the 29th Annual Western Protective Relay Conference Spokane, Washington, Oct. 22-24, 2002; 34 pages.
Roy Moxley PE, Chuck Petras PE, Chris Anderson, and Ken Fodero II; "Display and Analysis of Transcontinental Synchrophasors"; 16 pages. 2004.

* cited by examiner

*Primary Examiner*—Michael P Nghiem
(74) *Attorney, Agent, or Firm*—Fletcher Yoder (57) ABSTRACT

A phasor measurement system is provided for computing synchronized phasor measurements. The phasor measurement system includes acquisition circuitry for acquiring voltage or current values from a power line, sampling circuitry for sampling the voltage or current values, and processing circuitry for computing a phasor and at least one time derivative of the phasor based on the sampled voltage or current values and for computing a synchronized phasor value based on the phasor and the at least one time derivative of the phasor.

23 Claims, 3 Drawing Sheets

SYSTEM AND METHOD FOR SYNCHRONIZED PHASOR MEASUREMENT

BACKGROUND

The invention relates generally to the field of electrical power transmission networks and in particular to a technique for synchronized phasor measurement based on multi-parameter model of the fundamental frequency component of the signal.

The application of synchronized phasor measurements of voltages and currents from widely dispersed locations in an electrical power transmission network is well recognized for monitoring, operation and control of the power system network. Traditionally, power systems may be monitored through a combination of non-synchronized measurements, power flows and voltage magnitudes, feeding into a software model of the network which using other parameters of the network, calculates the balance of quantities. These quantities may however be calculated directly using synchronized phasor measurements (that is, phasor measurements with reference to absolute time). The phasor measurement unit (PMU) is considered to be one of the important measuring devices in the future of power systems because of its ability to provide synchronized phasor measurements. There are a variety of methods and many possible hardware implementations for providing synchronized phasor measurements.

However, the current techniques and phasor measurement units provide synchronized phasor measurements with desirable accuracy only in the steady state condition. During transient conditions, especially during power swings or during transient changes in power system frequency, both magnitude and phase angle change. Thus, Fourier-like algorithms derived from signal models that assume amplitude, frequency and phase angle to be constant for computing synchronized phase measurements, provide erroneous results as the assumptions are violated during transient conditions. Changes in amplitude, frequency, or phase angle generate cross coupling errors. For example, a change in phase angle creates an error in estimated magnitude, and a change in magnitude creates an error in estimated phase angles. Hence, present methods for computing synchronized phase measurements have limitations for achieving high levels of accuracy during the transient conditions.

It is therefore desirable to provide a signal model and a technique for synchronized phasor measurement based on the proposed signal model that would yield better accuracy under realistic system conditions, particularly during transient conditions.

BRIEF DESCRIPTION

Briefly, in accordance with one aspect of the technique, a method is provided for synchronized phasor measurement. The method provides for sampling voltage or current values, computing a phasor and at least one time derivative of the phasor based on the sampled voltage or current values, and computing a synchronized phasor value based on the phasor and the at least one time derivative of the phasor. Systems and computer programs that afford such functionality may be provided by the present technique.

In accordance with another aspect of the technique, a method is provided for synchronized phasor measurement. The method provides for sampling voltage or current values synchronously with respect to a GPS reference clock, computing a phasor and at least one time derivative of the phasor based on the sampled voltage or current values, and computing a synchronized phasor value based on the phasor and the at least one time derivative of the phasor without resampling the voltage or current values. Here again, systems and computer programs affording such functionality may be provided by the present technique.

In accordance with another aspect of the technique, a method is provided for synchronized phasor measurement. The method provides for sampling voltage or current values synchronously at a power system frequency, computing a phasor and at least one time derivative of the phasor based on the sampled voltage or current values, and computing a synchronized phasor value based on the phasor and the at least one time derivative of the phasor without resampling the voltage or current values. Here again, systems and computer programs affording such functionality may be provided by the present technique.

In accordance with another aspect of the technique, a method is provided for synchronized phasor measurement. The method provides for sampling voltage or current values at a frequency that is independent of a power system frequency and a reference clock frequency. The method also provides for computing a phasor and at least one time derivative of the phasor based on the sampled voltage or current values, and computing a synchronized phasor value based on the phasor and the at least one time derivative of the phasor without resampling the voltage or current values. Here again, systems and computer programs affording such functionality may be provided by the present technique.

In accordance with a further aspect of the present technique, a phasor measurement system is provided. The phasor measurement system includes acquisition circuitry for acquiring voltage or current values from a power line, sampling circuitry for sampling the voltage or current values, and processing circuitry for computing a phasor and at least one time derivative of the phasor based on the sampled voltage or current values and for computing a synchronized phasor value based on the phasor and the at least one time derivative of the phasor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
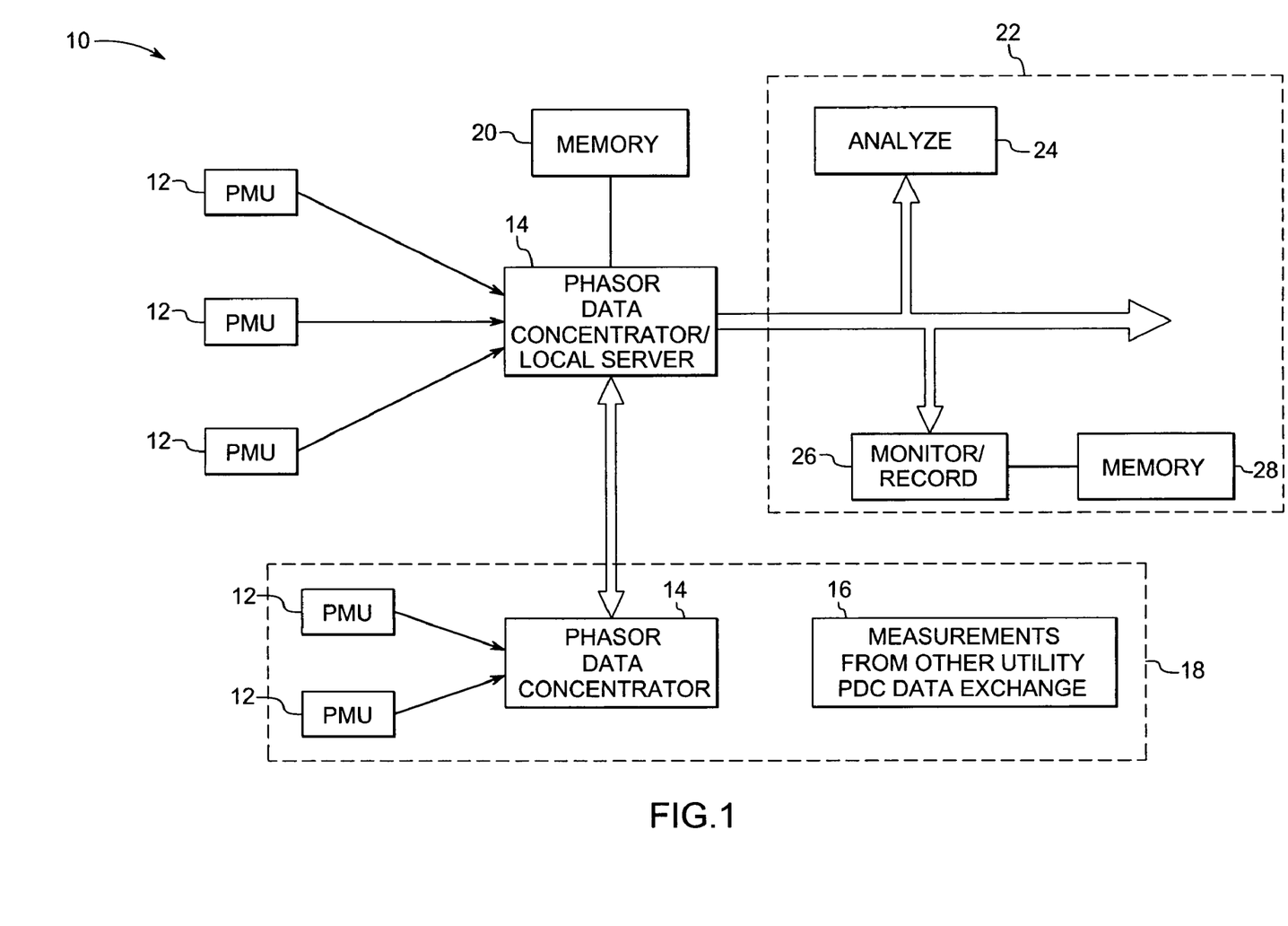
FIG. 1 is a block diagram of an exemplary phasor measurement system in accordance with one aspect of the present technique.

FIG. 1 is a block diagram of a phasor measurement system 10 implemented according to one aspect of the invention. The phasor measurement system 10 includes one or more phasor measurement units (PMUs) 12 placed at different locations or substations, for providing synchronized phasor measurement data of voltage, current and frequency, according to aspects of the present technique. In one embodiment, synchronized phasor measurement data may be provided in real time. The synchronized phasor measurement data or synchrophasors from various phasor measurement units 12 are then communicated to a phasor data concentrator (PDC) 14 or a dedicated local server at the control center. In one embodiment, the PMUs 12 may record synchrophasors locally and may then upload it to PDC 14 in batches. The PMU 12 uploads its time stamped phasor data using communication medium such as dedicated telephone line or fiber optic link or through the wide area network (WAN). It should be noted that the phasor measurement system 10 may be supported by communication infrastructure of sufficient speed to match the fast streaming PMU measurements.

The PDC 14 brings together synchrophasors from many sources including both PMUs 12 and other PDCs 16 and concentrates them into a single measurement set. The other PDCs 16 may be located in remote substations 18 in the power system network. In addition, the PDC 14 may correlate the data by timetag to create a system-wide measurement. The PDC 14 may export these measurements as a data stream as soon as they have been received and correlated. It sends the full set or selected subsets of the correlated data out to other applications. One or more applications can receive this data stream and use it for display, recording, and control functions.

Further, the PDCs 14 provide system management by monitoring all the input data for loss, errors and synchronization. It also can be used for data recording, continuous or only during disturbances. Additionally, the primary system monitoring function is done by the PDC 14 itself. It checks every measurement packet for errors in transmission. It monitors PMU time synchronization status and applies appropriate filters to eliminate spurious alarms. Among its possible functions are the detection of loss of transmission from PMUs and recording of a history log of these conditions, which can be used to assess system performance. The synchronized phasor measurement data may be additionally recorded in a memory 20 coupled to the PDCs 14 for the purpose of post-disturbance analysis or for tracking the state of a power system network. This may be advantageous because anomalies indicating power system instability may occur days before the instability becomes problematical. The PDC 14 may also output the synchronized phasor measurement data via serial or other network link to a central control and/or monitoring station 22.

The central control and/or monitoring station 22 may use the synchrophasors for monitoring, operation, control and/or protection of the power system network. For example, the synchrophasors may be analyzed via an analysis program 24 such as a MATLAB program or other specific programs. The synchrophasors may be further monitored via a monitor program 26 or recorded for future reference and analysis in an additional memory 28 located in the central control and/or monitoring station 22.

The exemplary phasor measurement system 10, as well as other phasor measurement systems based on synchrophasors, employs a phasor measurement unit (PMU) 12. A block diagram of such an exemplary PMU is provided in FIG. 2. As illustrated, the PMU 12 includes acquisition circuitry 30 for acquiring voltage or current values for each phase from a multiphase power line 32. The acquisition circuitry 30 may further include current sensors 34 and voltage sensors 36 for measuring current and voltage of each phase respectively. It should be noted that, in certain embodiments, an external acquisition system such as an IEC61850 process bus stream of samples may be employed to acquire voltage or current values for each phase from a multiphase power line 32. Each measurement of a current and/or voltage is processed by either a common or separate respective signal conditioner 38, which may include an amplifier and an anti-aliasing filter, for example. The anti-aliasing filter (low pass filter) is used to filter out from the input waveform frequencies above the Nyquist rate.

Figure 2:
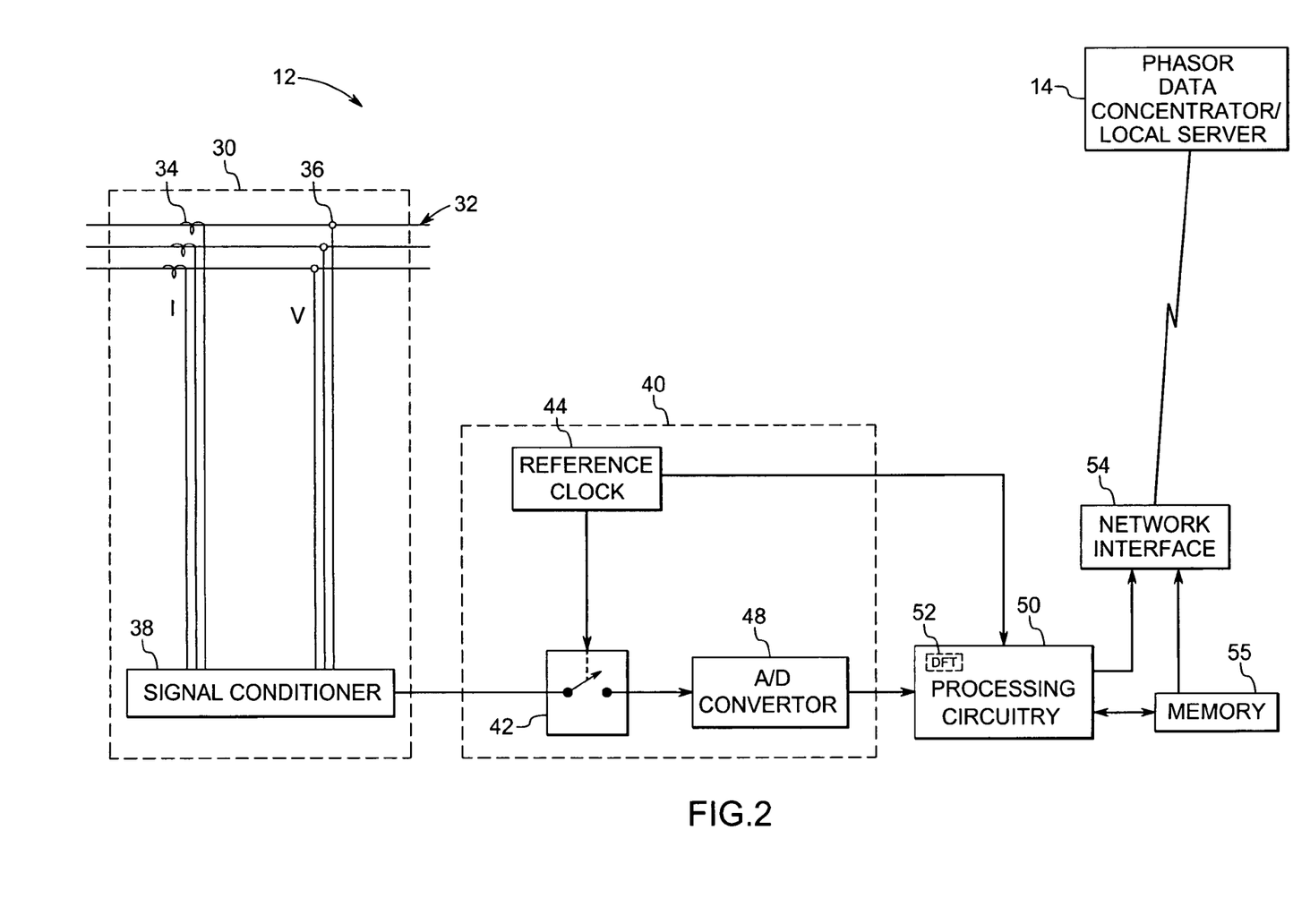
FIG. 2 is a block diagram of an exemplary phasor measurement unit for use in phasor measurement system of FIG. 1 in accordance with one aspect of the present technique.

Further, each conditioned signal is sampled at constant or changing time intervals via sampling circuitry 40. The sampling circuitry includes a sampler 42 that samples the conditioned signal at a sampling rate as determined by the sampling signal that is referenced to a reference or sampling clock 44. In the present technique, a wide variety of reference or sampling clocks 44 may be selected for the purpose of sampling. For example, in one embodiment the reference clock 44 is a GPS (global positioning system)-based clock that provides an absolute time reference. The common synchronizing signal is available from the GPS-based clock to all PMUs. In another embodiment, the reference clock is derived from the power system signals in a frequency-tracking mode of operation such that the reference clock provides sampling signals at a power system frequency. Finally, the system may operate independent of a reference clock.

As will be appreciated by those skilled in the art, the present technique may be operated in these several different modes for establishing the sampling frequency. In the first mode, the reference clock is a standard, accurate clock, such as a GPS-based clock used for both the sampling that is not necessarily synchronized with the power system frequency. In this case, the present technique corrects for errors introduced by off-frequency effects when the power system frequency is not synchronous with the GPS clock. In the second mode, the sampling clock is based on the power system frequency. In the third mode, the sampling clock may be free running at an appropriate frequency or a suitable sampling rate that may not be synchronized to either the power system frequency or the GPS frequency.

The resulting analog sampled output is then converted to a digital data signal by either a common or separate respective analog-to-digital converter 48 wherein the data represents the magnitude of the input voltage and/or current at the sampling instant. The analog-to-digital converter 48 may be a part of the sampling circuitry 40. The digital data signals acquired at precise and pre-defined moments in time are then processed via processing circuitry 50 such as an application-specific digital controller or a microprocessor to generate synchrophasors according to aspects of the present technique. In one embodiment, the synchrophasors are computed by the processing circuitry 50 using a Discrete Fourier Transform (DFT) 52. The DFT computation is referenced to the UTC time derived from GPS. This precise time reference facilitates comparison of phase angles between stations. In one embodiment, the processing circuitry 50 computes a phasor and at least one time derivative of the phasor. The synchronized phasor value is then computed based on the phasor and the at least one time derivative of the phasor by compensating the phasor with the at least one time derivative of the phasor for effects of transients in magnitude or phase angle of the phasors. Further, it should be noted that the processing circuitry 50 may compute the synchronized phasor value without resampling the voltage or current values for each phase. Finally, the phasor is combined into a data frame with all other phasors from the same PMU 12 along with time stamp and status information, and the frame is transmitted to the PDC 14 via a network interface 54 such as a modem. Alternatively, the frame may be stored locally in a PMU memory 55 coupled to the processing circuitry 50 and may then be upload to the PDC 14 in batches via the network interface 54.

In a present embodiment, the processing circuitry 50 as described above computes the synchrophasors based on a proposed signal model:

$$x(t) = (A + k_A \cdot (t - t_0)) \cdot \cos(2 \cdot \pi \cdot f + \Theta + k_\Theta \cdot (t - t_0)) \quad (1)$$

where:
- $t_0$—is the time mark to report a synchrophasor;
- $A$—is a parameter of the signal model to be reported (magnitude);
- $\Theta$—is another parameter of the signal model to be reported (phase angle);
- $f$—is a parameter of the signal model estimated using a separate procedure;
- $k_A$—is a parameter of the signal model (rate of change of the magnitude); and
- $k_\Theta$—is another parameter of the signal model (rate of change of the phase).

The model assumes constant frequency in the time window of the estimator and linearly changing magnitude and phase. In steady states the values of both $k_A$ and $k_\Theta$ are zero. The estimator will report values of the linearly changing magnitude and angle at the mark as driven by the absolute clock. It should be noted that the absolute time may be eliminated from the equations by using a count value, such as a relative microsecond count with respect to the mark. Thus, equation (1) can be expressed as:

$$x(\tau) = (A + k_A \cdot \tau) \cdot \cos(2 \cdot \pi \cdot f + \Theta + k_\Theta \tau) \quad (2)$$

where $\tau = t - t_0$ is a time from the synchrophasor mark, $t_0$ (from the absolute time).

Further, it should be noted that the sampling rate (constant or changing within the window) does not influence the synchrophasors measurement in the present technique and any window size may be selected for the computation of synchrophasors. For example, the results will be accurate 2 cycles backward and one cycle forward with respect to the synchrophasor mark. Moreover, it may be advantageous to estimate syncrophasors in a three-phase system from positive sequence voltages to avoid possible errors that could result from the operation of combining the phase vectors into the positive sequence. Alternatively, a "positive-sequence" Clarke component may be used instead of the positive sequence, particularly during transient conditions.

A multi-parameter signal model solution is then developed for computation of synchrophasors based on equation (1). The foundation of the multi-parameter solution is least mean square estimation theory. The parameters are selected so as to minimize the sum of the squares of the differences between the actual samples and the samples predicted by the model, with respect to the parameters. It should be noted that the higher the number of parameters for the multi-parameter signal model solution, the better is the accuracy of synchrophasors. The multi-parameter signal model solution may be implemented via one or more computational techniques.

For example, in one embodiment, a four-parameter signal model solution is developed for computation of synchrophasors. In one implementation of four-parameter signal model solution, the time rate of change of the magnitude and the phase angle of the phasor are estimated separately. Two-parameter phasors are then computed and compensated with estimates of time rate of change of phase angle and magnitude. The mathematical model for implementation of above method is described in greater detail below. The one cycle, two-parameter phasor is computed using a time window that is exactly centered on the defining time reference:

$$\overline{Y} = \text{one-cycle, two-parameter estimator} \quad (3)$$

$$\overline{Y} = \frac{2}{N} \sum_{n=-\frac{N}{2}}^{\frac{N}{2}-1} x[n] \cdot e^{-j(n+1/2)\frac{2\pi}{N}}$$

$$x[n] = x\left(t_0 + \frac{n+1/2}{N \cdot f}\right)$$

$t_0$ = defining time reference where $\overline{Y}$ is the classical phasor estimator or the conventional estimate, $x[n]$ represents data samples at time $t[n]$ and $N$ is the number of samples per cycle. In one embodiment, 64 samples may be acquired per cycle. Alternatively, a different number of samples may be collected, with presently contemplated embodiments envisioning 128 samples per cycle or 32 samples per cycle. It should be noted that, ideally, the weighting coefficients and the samples are taken at the midpoints of the time steps. In some cases, such as with frequency tracking, it may not be possible to align $t_0$ to the center of the time window. In that case, the approach is to measure the time at the center of the sampling window, and adjust the final answer accordingly with a phasor rotation. The following calculation may be used for estimating the center of the sample window in the face of small clock measurement errors:

$$\hat{t}_0 = \frac{1}{N} \sum_{n=-\frac{N}{2}}^{\frac{N}{2}-1} t[n] \quad (4)$$

$\hat{t}_0$ = estimate of the time at the center of the sampling widow $t[n]$ = GPS time at the $n$'th data sample The rate of change parameters, for both the phase angle and the magnitude are then separately computed by computing the change of magnitude and phase angle from cycle to cycle. The following parameters are employed:

$$k_\Theta = \frac{d\Theta}{dt} \quad (5)$$

$$k_{AA} = \frac{k_A}{|\overline{A}|} = \frac{d\ln(|\overline{A}|)}{dt}$$

$|\overline{A}|$ = magnitude of $\overline{A}$

The compensated four-parameter phasor for any reporting time or desired time t within the window is then computed as:

$$\overline{A}_{IEEE}(t) = \quad (6)$$

$$\left((1 + (t - \hat{t}_0) \cdot (j \cdot k_\Theta + k_{AA})) \cdot \overline{Y} - \left(\frac{k_\Theta}{4\pi \cdot f} + \frac{j \cdot k_{AA}}{4\pi \cdot f}\right) \cdot \overline{Y}^*\right) \cdot e^{j \cdot 2\pi f \cdot (t - \hat{t}_0)}$$

As will be appreciated by one skilled in the art, the final factor of $e^{j \cdot 2\pi f \cdot (t-\hat{t}_0)}$ is included to comply with the IEEE standard. It rotates the phasor from the measured reference time to the reporting time tag. Without it, the phasor produced by equation (6) would be the value at time t, with respect to $t_0$ as a reference. It is the correction provided for not sampling the data when the reporting was desired. It should be noted that $(t-\hat{t}_0)$ is equal to zero for desired times corresponding exactly to the time of the GPS clock.

Alternatively, in another implementation of four-parameter signal model solution, four-parameter phasors may be computed directly, using weighted sums of the samples in the window. The mathematical model for implementation of above method is described in greater detail as follows. The following weighted sums of the samples and times are computed:

$$\hat{t}_0 = \frac{1}{N} \sum_{n=-\frac{N}{2}}^{\frac{N}{2}-1} t[n] \quad (7)$$

$$\overline{Y} = \frac{2}{N} \sum_{n=-\frac{N}{2}}^{\frac{N}{2}-1} x[n] \cdot e^{-j(n+1/2)\frac{2\pi}{N}}$$

$$\overline{Z} = \frac{2}{N} \sum_{n=-\frac{N}{2}}^{\frac{N}{2}-1} x[n] \cdot \frac{(n+1/2)}{N} \cdot e^{-j(n+1/2)\frac{2\pi}{N}}$$

From the values produced by equations (7), estimates the true phasor and rate of change of phasor at the reference time are determined, using the following equation:

$$\begin{bmatrix} 1 & \frac{1}{2N\sin\left(\frac{2\pi}{N}\right)} & 0 & 0 \\ \frac{1}{2N\sin\left(\frac{2\pi}{N}\right)} & \left(\frac{1}{12}\left(1-\frac{1}{N}\right)-\frac{1}{2N^2\left(\sin\left(\frac{2\pi}{N}\right)\right)^2}\right) & 0 & 0 \\ 0 & 0 & 1 & \frac{1}{2N\sin\left(\frac{2\pi}{N}\right)} \\ 0 & 0 & \frac{1}{2N\sin\left(\frac{2\pi}{N}\right)} & \left(\frac{1}{12}\left(1-\frac{1}{N}\right)+\frac{1}{2N^2\left(\sin\left(\frac{2\pi}{N}\right)\right)^2}\right) \end{bmatrix} \cdot \begin{bmatrix} A_{real} \\ \frac{\dot{A}_{imag}}{f} \\ A_{imag} \\ \frac{\dot{A}_{real}}{f} \end{bmatrix} = \begin{bmatrix} Y_{real} \\ Z_{imag} \\ Y_{imag} \\ Z_{real} \end{bmatrix} \quad (8)$$

For N=64, the inverse of equation (8) becomes:

$$\begin{bmatrix} A_{real} \\ \frac{\dot{A}_{imag}}{f} \\ A_{imag} \\ \frac{\dot{A}_{real}}{f} \end{bmatrix} \approx \begin{bmatrix} 1.100884845 & -1.265720835 & 0 & 0 \\ -1.265720835 & 15.87997909 & 0 & 0 \\ 0 & 0 & 1.071878885 & -0.9018064278 \\ 0 & 0 & -0.9018064278 & 11.31423836 \end{bmatrix} \begin{bmatrix} Y_{real} \\ Z_{imag} \\ Y_{imag} \\ Z_{real} \end{bmatrix} \quad (9)$$

The four-parameter phasor estimate for any reporting time within the window is then computed as:

$$\overline{A}_{IEEE}(t) = \left(\overline{A} + (t - \hat{t}_0) \cdot f \cdot \left(\frac{\dot{\overline{A}}}{f}\right)\right) \cdot e^{j \cdot 2\pi f \cdot (t - \hat{t}_0)} \tag{10}$$

$$\overline{A} = A_{real} + jA_{imag}$$

$$\frac{\dot{\overline{A}}}{f} = \frac{\dot{A}_{real}}{f} + j\frac{\dot{A}_{imag}}{f}$$

$t$ = reporting time

It should be noted that, in either implementation, there is provision for adjusting the phasor estimate for the time difference between when the phasor is computed and the reporting time tag. It should also be noted that both implementations have been worked out for a one-cycle window. As will be appreciated by one skilled in the art other window sizes are possible with slight variation in the implementation details.

For example, in one embodiment, a two-cycle, four-parameter signal model solution may be implemented for computing synchrophasors. The method includes computing two-parameter phasors, and then compensating with an estimate of "A dot" or a first time derivative of the phasor where A is the compensated four-parameter phasor. The mathematical model for implementation of above method is described in greater detail below. The one-cycle, two-parameter phasor is computed using equation (3) and (4) as described above. Then, the "Y" values are computed for every cycle:

$$\overline{Y}_M = \overline{Y} \text{ computed for the M'th cycle.} \tag{11}$$

From pairs of "Y" values, an estimate of "A dot" is computed:

$$\frac{\dot{\overline{A}}_M}{f} = \overline{Y}_M - \overline{Y}_{M-1} \tag{12}$$

Finally, an estimate of A is computed from derived values of "Y" and "A dot":

$$\overline{A}_M = \overline{Y}_M - j \cdot \frac{(\overline{Y}^*_M - \overline{Y}^*_{M-1})}{2N \sin\left(\frac{2\pi}{N}\right)} \tag{13}$$

$\overline{Y}^*_M = \overline{Y}_M$ conjugate

As will be appreciated by those skilled in the art, the two-cycle, four-parameter signal model solution yields higher accuracy and more simplified implementation to compute synchrophasors. In some applications, it may be desired to compute one-cycle phasors every ½-cycle to improve transient response. The implementation is very similar to the one described above. In such cases, it may be advantageous to accommodate two effects. Firstly, phasors computed according to equation (3) and according to the proposed IEEE standard, are rotating phasors, and therefore change sign every nominal ½-cycle. Secondly, to compute time derivatives from ½-cycle spacing, a factor of two is needed. Equations (11), (12) and (13) are therefore modified accordingly. One-cycle "Y" values are computed for every ½ cycle:

$$\overline{Y}_M = \text{one cycle } \overline{Y} \text{ computed for the M'th half cycle.} \tag{14}$$

From pairs of "Y" values, estimates of "A dot" are computed:

$$\frac{\dot{\overline{A}}_M}{f} = 2(\overline{Y}_M + \overline{Y}_{M-1}) \tag{15}$$

Finally, an estimate of A is computed from derived values of "Y" and "A dot":

$$\overline{A}_M = \overline{Y}_M - j \cdot \frac{(\overline{Y}^*_M + \overline{Y}^*_{M-1})}{N \sin\left(\frac{2\pi}{N}\right)} \tag{16}$$

$\overline{Y}^*_M = \overline{Y}_M$ conjugate

In another embodiment, a two-cycle, six-parameter signal model solution may be implemented for computing even more accurate synchrophasors. The method includes computing two-parameter phasors, and then compensating with estimates of the first and the second time derivatives of the phasor. The implementation algorithm is described in greater detail below. The one-cycle, two-parameter phasor is computed using equation (3) and (4) as described above. Then, the "Y" values are computed for every nominal cycle:

$$\overline{Y}_M = \overline{Y} \text{ computed for the M'th cycle.} \tag{17}$$

In other words, a series of "Y" values are computed using the classical algorithm, at any sampling rate that may be implemented. For each "Y" value that is adjusted to fit a six-parameter model, the first and second time derivatives are estimated from three "Y" values:

$$\frac{\dot{\overline{A}}_M}{f} = \frac{3}{2}\overline{Y}_M - 2\overline{Y}_{M-1} + \frac{1}{2}\overline{Y}_{M-2} \tag{18}$$

$$\frac{\ddot{\overline{A}}_M}{f^2} = \overline{Y}_M - 2\overline{Y}_{M-1} + \overline{Y}_{M-2} \tag{19}$$

It should be noted that the derivates may be computed for each cycle. If frequency tracking is employed, $f$ is the actual sampling frequency. Finally, an adjusted estimate of A is computed from derived values of "Y" and the first and second time derivatives of "A":

$$\overline{A}_M = \overline{Y}_M - j \cdot \frac{\left(\frac{3}{2}\overline{Y}^*_M - 2\overline{Y}^*_{M-1} + \frac{1}{2}\overline{Y}^*_{M-2}\right)}{2N \sin\left(\frac{2\pi}{N}\right)} - \tag{20}$$

$$\frac{1 - \frac{1}{N}}{24} \cdot (\overline{Y}_M - 2\overline{Y}_{M-1} + \overline{Y}_{M-2}) -$$

$$\frac{\cos\left(\frac{2\pi}{N}\right)}{2N^2 \left(\sin\left(\frac{2\pi}{N}\right)\right)^2} \cdot (\overline{Y}^*_M - 2\overline{Y}^*_{M-1} + \overline{Y}^*_{M-2})$$

$\overline{Y}^*_M = \overline{Y}_M$ conjugate

Synchrophasors are then computed as:

$$\bar{A}_{IEEE}(t) = \left(\bar{A} + (t-t_0) \cdot f \cdot \left(\frac{\dot{\bar{A}}}{f}\right) + \frac{((t-t_0) \cdot f)^2}{2} \cdot \left(\frac{\ddot{\bar{A}}}{f}\right)\right) \cdot e^{j 2\pi f \cdot (t-t_0)} \quad (21)$$

As described above, one-cycle phasors may be computed every ½-cycle to improve transient response. Equations (17), (18), (19) and (20) are therefore modified accordingly. One-cycle "Y" values are computed for every ½ cycle:

$$\bar{Y}_M = \text{one cycle } \bar{Y} \text{ computed for the M'th half cycle.} \quad (22)$$

For each "Y" value that is adjusted to fit a six-parameter model, estimates of the first and second time derivatives are computed from three "Y" values:

$$\frac{\dot{\bar{A}}_M}{f} = 3\bar{Y}_M + 4\bar{Y}_{M-1} + \bar{Y}_{M-2} \quad (23)$$

$$\frac{\ddot{\bar{A}}_M}{f^2} = 4\bar{Y}_M + 8\bar{Y}_{M-1} + 4\bar{Y}_{M-2} \quad (24)$$

Finally, an adjusted estimate of A is computed from derived values of "Y" and the first and second time derivatives of "A":

$$\bar{A}_M = \bar{Y}_M - j \cdot \frac{(3\bar{Y}_M^* + 4\bar{Y}_{M-1}^* + \bar{Y}_{M-2}^*)}{2N\sin\left(\frac{2\pi}{N}\right)} -$$

$$\frac{1 - \frac{1}{N}}{24} \cdot (4\bar{Y}_M + 8\bar{Y}_{M-1} + 4\bar{Y}_{M-2}) -$$

$$\frac{\cos\left(\frac{2\pi}{N}\right)}{2N^2 \left(\sin\left(\frac{2\pi}{N}\right)\right)^2} \cdot (4\bar{Y}_M^* + 8\bar{Y}_{M-1}^* + 4\bar{Y}_{M-2}^*) \quad (25)$$

$$\bar{Y}_M^* = \bar{Y}_M \text{ conjugate}$$

As will be appreciated by those skilled in the art, the synchrophasors may be calculated for ½ cycle, one cycle, two cycles, or any other fraction of a cycle or any other multiple of a cycle. It should also be noted that depending upon the desired accuracy, multi-parameter signal model solutions may be derived for higher number of parameters. For example, in alternative embodiments, eight-parameter, ten-parameter or twelve-parameter signal model solutions may be implemented. As the number of parameters increases, higher order time derivatives will generally be estimated. Further, it should be noted that the techniques described above may employ frequency tracking at fixed sampling rates, aiding in the measurement of magnitude shift. Alternatively, the techniques described above may sample the data at any sampling rate for measurement of frequency, magnitude and phase angle for each phase. As will be appreciated by those skilled in the art, the control equations (1) to (25) can be easily realized using standard digital logic and implemented in a general purpose or custom digital controller or microprocessor. It can also be implemented in a microcontroller or a DSP.

Figure 3:
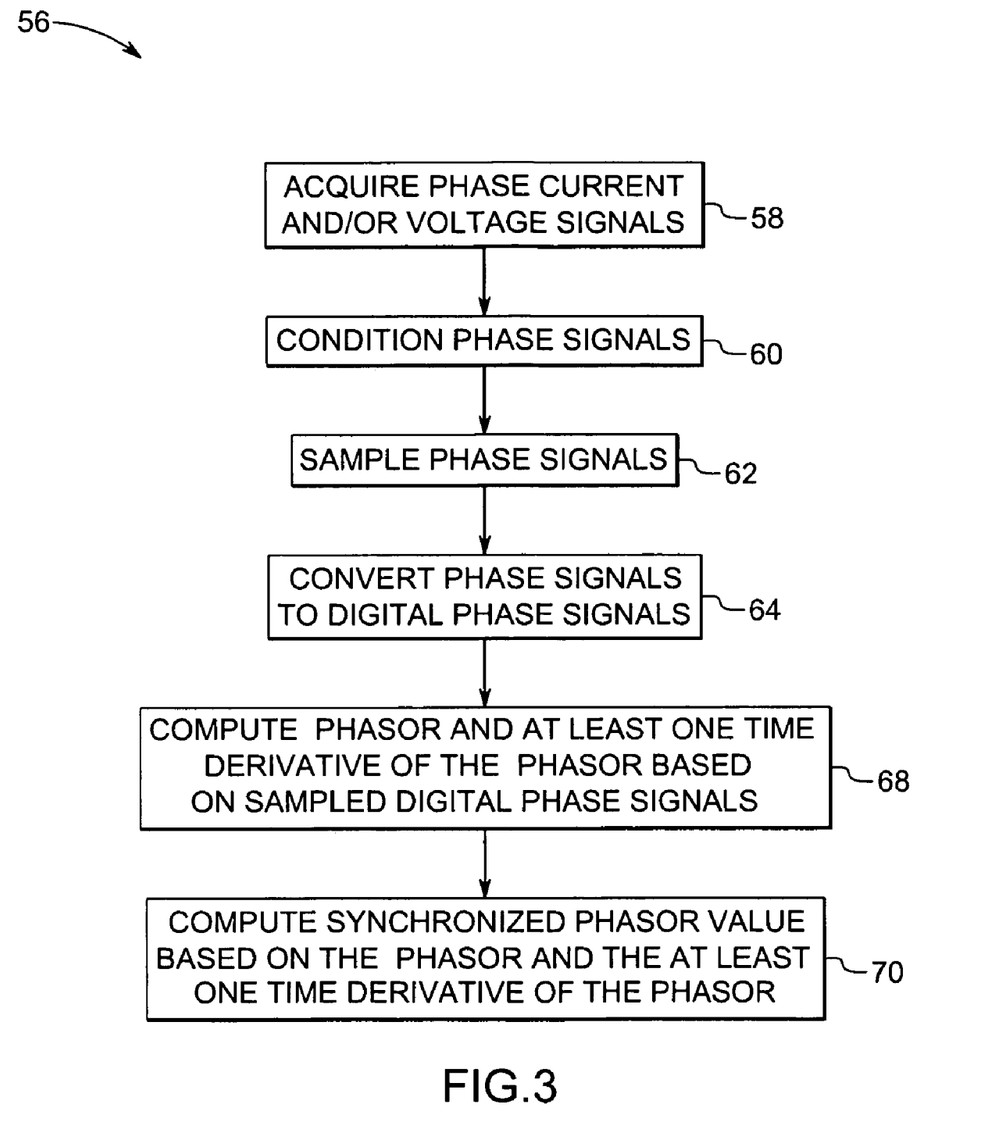
FIG. 3 is a flowchart illustrating an exemplary process for synchronized phasor measurement in accordance with one aspect of the present technique.

A control scheme 56 for computation of synchrophasors is represented via the flowchart as shown in FIG. 3. The control scheme 56 includes the steps of acquiring phase current and/or voltage signals at step 58, conditioning phase signal at step 60, sampling acquired phase signals at step 62 and converting the sampled phase signal to digital phase signals at step 64. The control scheme 56 continues by computing phasors and at least one time derivative of the phasor based on sampled digital phase signals as described in various embodiments discussed above at step 68. The synchronized phasor is then computed based on the phasor and the at least one time derivative of the phasor as described above at step 70.

The measurement of synchrophasors via the various techniques described above may find application in a wide range of applications. For example, the techniques may facilitate providing wide area control of the power system network. The techniques as described in various embodiments mentioned above takes into account both the rate of change of phase angle and/or magnitude of the phasor value being measured in addition to the usual value itself. This eliminates phase and magnitude errors that may otherwise arise, and therefore provides accurate phasor information during frequency and/or power disturbances in power systems that lead to transient variations in phase angle and/or magnitude. Phasor measurement can be used for event analysis and data gathering applications, and also for monitoring, operation, and control of power system network. They have advantages over traditional methods in high-speed and wide-area measurements. These advantages may be useful in both real-time systems and post-event analysis.

By way of further example, synchrophasors computed by the techniques described in various embodiments discussed above may be used for a wide variety of power system applications such as synchrocheck and fast bus transfer. Synchrocheck (check of synchronism) is a feature that verifies in real time if two points in a three-phase power system are in relative synchronism. The feature is used to supervise automatic or manual closing of a circuit breaker (e.g., the breaker is allowed to close only if the two points in the power system about to be linked by closing the breaker operate synchronously). Synchronism means that the magnitudes and frequencies of the two points are almost identical while the angles are relatively close. The three dimensions of the synchrocheck, magnitude, angle and frequency, are typically measured from single-phase voltages taken from both sides of the breaker. In some applications, a relatively large frequency difference is allowed. This means that the two voltage vectors rotate at relatively different speeds. At times the two vectors are perfectly in phase, and at times they are out of phase. Still, the synchrocheck function is expected to release the breaker for closing. This should be done, however, at a moment in time that would yield an actual closing of the breaker when the two voltages are in phase. Because of a finite breaker closing time (few tens of milliseconds) the close command must be given ahead of time by the synchrocheck function.

The synchrocheck function may impose the following requirements on the phasor estimators: the magnitudes and angles are measured with reasonable accuracy despite the fact that the two signals are of different frequencies or the frequency may be changing; and the magnitude and angle difference between the two signals is predicted to compensate for the breaker closing time (close command in advance). The phasor measurement method as described in the various embodiments mentioned above addresses the above requirements efficiently. Firstly, the method is immune to off-nominal frequencies. This means that the two signals may be of different frequencies as compared with the device tracking frequency, and both the signals are measured with zero error due to the off-nominal frequencies. The tracking frequency becomes secondary. That is, the device may track to one of the two signals, and the other will still be measured accurately; or may not track at all, and both signals will be measured accurately as long as the signal frequency is reasonably close to nominal, which is typically the case. Secondly, being immune to off-nominal frequencies, the algorithm does not respond to changes in the frequency, and remains accurate even if the signal frequency changes while the tracking frequency controller does not follow the signal frequency closely. Thirdly, the algorithm allows calculating the phasor at one point in time, while the data window is taken at a different point in time. This allows very straightforward prediction of both the magnitude and angle. Due to higher order extrapolation, the accuracy of prediction is good for time spans of few tens of milliseconds even if both the magnitude and angle change relatively fast. In normal system conditions, various points in the system stay in synch and the application of the synchrocheck is rather secondary. During system disturbances such as those leading to major system blackouts, the operating conditions for the synchrocheck feature become more difficult while the response becomes more important. The techniques described above provide accurate measurement during such transient conditions and is therefore very efficient for synchrocheck application.

A yet another application where the techniques described above may be employed is fast bus transfer. A Bus Transfer Scheme is a control device that automatically re-connects spinning motors from their primary source of supply (main bus) to an alternate supply (alternate bus) should the primary source fail for any reason. This is done to ensure uninterrupted service of critical motor loads such as in power or chemical plants. The operation of transferring is accomplished by the following sequence of operations: detecting loss of the main supply, opening the associate breaker (main), checking synchronism between the slowing down motors and the alternative source of supply, and closing, at an appropriate point in time, the other breaker (tie) in order to re-connect the motors to the secondary source.

In order to avoid motor damage, or stalling, the re-connection must be done at well-tuned moments in time and only after satisfying certain conditions. This yields three types of transfer schemes:

1. Fast transfer scheme reconnects the motors if the motor voltage is relatively close to the level of the alternate source (some 90%) and the angle difference is relatively small (some 30 deg). Under these conditions the stress on the motor is low enough to guarantee a smooth ride through.
2. In-phase transfer takes place if the fast transfer opportunity is missed. This mode requires angles to be well aligned (some 10%) even if the magnitudes are quite different. This transfer results in larger stress on the motors, but at least the produced torque is aligned with positions of the rotors and a relatively smooth re-start takes place.
3. Residual voltage transfer takes place if the in-phase transfer opportunity is missed. This mode requires the motor voltage to decay below some 33% to allow the transfer regardless of the angle difference. This is almost equivalent to starting completely stopped motors, and one must make sure by off-line calculations that the alternate bus is capable of picking up all the connected motors at the same time.

Similarly to a straight synchcheck function, the relative difference in magnitudes and angles between the alternate source and motor voltages are checked. In case of fast and in-phase transfers, the breaker advance time must be applied, i.e. the closing pulse for the breaker must be given ahead compared with the time the condition is becoming satisfied. This application is more demanding than a simple synchrocheck for the following reasons: magnitude of the motor voltage decays relatively fast, frequency of the motor voltage changes constantly as the motors slow down; and the relative difference in frequencies between the motor and source voltages is larger. Again, being insensitive to frequency shift and frequency changes, and capable of predicting both magnitude and angle, the new algorithm suits very naturally this application. Traditional approaches call for separate predictors for magnitude and angle that are superimposed on a classical Fourier-like straightforward phasor estimator.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for synchronized phasor measurement in a multiphase power system, the method comprising:
sampling voltage or current values;
computing a phasor and at least one time derivative of the phasor based on the sampled voltage or current values;
computing a synchronized phasor value based on the phasor and the at least one time derivative of the phasor, wherein computing the synchronized phasor value comprises compensating the phasor with the at least one time derivative of the phasor for effects of transients in magnitude or phase angle of the phasors; and
controlling or monitoring an electrical device based upon the synchronized phasor value.

2. The method of claim 1, wherein sampling comprises sampling voltage or current values synchronously with respect to a global positioning system reference clock.

3. The method of claim 1, wherein sampling comprises sampling voltage or current values synchronously at a power system frequency.

4. The method of claim 1, wherein sampling comprises sampling voltage or current values at a frequency that is independent of a power system frequency and a reference clock frequency.

5. The method of claim 1, wherein computing the phasor comprises computing the phasor for an integer multiple of half a power system cycle.

6. The method of claim 1, wherein the at least one time derivative of the phasor comprises a first order time derivative, or a second order time derivative of the phasor.

7. The method of claim 1, further comprising computing the synchronized phasor value based on difference between a sample time and a desired time.

8. The method of claim 7, wherein the desired time is a reference clock time.

9. The method of claim 7, wherein the desired time is after an actual sampling time or in between two actual sampling times to provide the synchronized phasor value.

10. The method of claim 1, wherein computing the synchronized phasor value comprises computing the synchronized phasor value without resampling the voltage or current values.

11. A method for synchronized phasor measurement in a multiphase power system, the method comprising:
sampling voltage or current values synchronously with respect to a global positioning system reference clock;
computing a phasor and at least one time derivative of the phasor based on the sampled voltage or current values;

computing a synchronized phasor value based on the phasor and the at least one time derivative of the phasor without resampling the voltage or current values, wherein computing the synchronized phasor value comprises compensating the phasor with the at least one time derivative of the phasor for effects of transients in magnitude or phase angle of the phasors; and controlling or monitoring an electrical device based upon the synchronized phasor value.

12. A method for synchronized phasor measurement in a multiphase power system, the method comprising:

sampling voltage or current values synchronously at a power system frequency;

computing a phasor and at least one time derivative of the phasor based on the sampled voltage or current values;

computing a synchronized phasor value based on the phasor and the at least one time derivative of the phasor without resampling the voltage or current values, wherein computing the synchronized phasor value comprises compensating the phasor with the at least one time derivative of the phasor for effects of transients in magnitude or phase angle of the phasors; and controlling or monitoring an electrical device based upon the synchronized phasor value.

13. A method for synchronized phasor measurement in a multiphase power system, the method comprising:

sampling voltage or current values at a frequency that is independent of a power system frequency and a reference clock frequency;

computing a phasor and at least one time derivative of the phasor based on the sampled voltage or current values;

computing a synchronized phasor value based on the phasor and the at least one time derivative of the phasor without resampling the voltage or current values, wherein computing the synchronized phasor value comprises compensating the phasor with the at least one time derivative of the phasor for effects of transients in magnitude or phase angle of the phasors; and controlling or monitoring an electrical device based upon the synchronized phasor value.

14. A phasor measurement system, comprising:

acquisition circuitry for acquiring voltage or current values from a power line;

sampling circuitry for sampling the voltage or current values; and processing circuitry for computing a phasor and at least one time derivative of the phasor based on the sampled voltage or current values and for computing a synchronized phasor value based on the phasor and the at least one time derivative of the phasor, wherein computing the synchronized phasor value comprises compensating the phasor with the at least one time derivative of the phasor for effects of transients in magnitude or phase angle of the phasors.

15. The phasor measurement system of claim 14, further comprising a network interface in communication with other phasor measurement systems or a central control station.

16. The phasor measurement system of claim 14, wherein the sampling circuitry samples the voltage or current values synchronously with respect to a global positioning system reference clock.

17. The phasor measurement system of claim 14, wherein the sampling circuitry samples the voltage or current values synchronously at a power system frequency.

18. The phasor measurement system of claim 14, wherein the sampling circuitry samples the voltage or current values at a frequency that is independent of a power system frequency and a reference clock frequency.

19. The phasor measurement system of claim 14, wherein the processing circuitry compute the synchronized phasor value without resampling the voltage or current values.

20. A computer readable media, comprising:

code adapted to sample voltage or current values;

code adapted to compute a phasor and at least one time derivative of the phasor based on the sampled voltage or current values;

code adapted to compute a synchronized phasor value based on the phasor and the at least one time derivative of the phasor, wherein the code adapted to compute the synchronized phasor value comprises code adapted to compensate the phasor with the at least one time derivative of the phasor for effects of transients in magnitude or phase angle of the phasors; and code adapted to control or monitor an electrical device based upon the synchronized phasor value.

21. A method for synchronized phasor measurement in a multiphase power system, the method comprising:

sampling voltage or current values;

computing a phasor and at least one time derivative of the phasor based on the sampled voltage or current values;

computing a synchronized phasor value based on the phasor, the at least one time derivative of the phasor, and a difference between a sample time and a desired time; and controlling or monitoring an electrical device based upon the synchronized phasor value.

22. The method of claim 21, wherein the desired time is a reference clock time.

23. The method of claim 21, wherein the desired time is after an actual sampling time or in between two actual sampling times to provide the synchronized phasor value.

* * * * *